United States Patent
Kim et al.

(10) Patent No.: US 10,837,115 B2
(45) Date of Patent: Nov. 17, 2020

(54) PRE-TREATMENT COMPOSITION BEFORE ETCHING SIGE AND METHOD OF FABRICATING SEMICONDUCTOR DEVICE USING THE SAME

(71) Applicant: SAMSUNG ELECTRONICS CO., LTD., Suwon-si (KR)

(72) Inventors: Soojin Kim, Seoul (KR); Hyo-Sun Lee, Hwaseong-si (KR); Jung-Min Oh, Incheon (KR); Hyosan Lee, Hwaseong-si (KR); Donghyun Kim, Yongin-si (KR); Haksoo Kim, Yongin-si (KR); Jung Jae Oh, Yongin-si (KR); Myung Ho Lee, Yongin-si (KR)

(73) Assignees: Samsung Electronics Co., Ltd., Suwon-si (KR); ENF Technology Co., Ltd., Youngin-si (KR)

( * ) Notice: Subject to any disclaimer, the term of this patent is extended or adjusted under 35 U.S.C. 154(b) by 0 days.

(21) Appl. No.: 16/139,506

(22) Filed: Sep. 24, 2018

(65) Prior Publication Data
US 2019/0284701 A1  Sep. 19, 2019

(30) Foreign Application Priority Data

Mar. 15, 2018 (KR) .................. 10-2018-0030385

(51) Int. Cl.
*C23C 22/48* (2006.01)
*C09K 13/08* (2006.01)
(Continued)

(52) U.S. Cl.
CPC ............ *C23C 22/48* (2013.01); *C09K 13/00* (2013.01); *C09K 13/06* (2013.01); *C09K 13/08* (2013.01);
(Continued)

(58) Field of Classification Search
None
See application file for complete search history.

(56) References Cited

U.S. PATENT DOCUMENTS

| 5,932,757 A * | 8/1999 | Standke | B01J 2/30 |
| | | | 556/457 |
| 6,361,871 B1 * | 3/2002 | Jenkner | C09D 4/00 |
| | | | 427/387 |

(Continued)

FOREIGN PATENT DOCUMENTS

| KR | 10-0652407 B1 | 12/2006 |
| KR | 10-2017-0034036 A | 3/2017 |

(Continued)

*Primary Examiner* — Allan W. Olsen
(74) *Attorney, Agent, or Firm* — Lee IP Law, PC

(57) ABSTRACT

A pre-treatment composition for use before etching SiGe includes an acid, an alcohol, and a silane compound having a chemical formula $R-Si(R^1)_n(OR^2)_{3-n}$ in which R is (C3-C20)alkyl, (C6-C12)aryl, (C6-C12)aryl(C3-C20)alkyl, or (C3-C20)alkyl(C6-C12)aryl, $R^1$ is hydrogen, hydroxyl, halogen, (C1-C20)alkyl, halo(C1-C20)alkyl, (C6-C12)aryl, (C6-C12)aryl(C1-C20)alkyl, or (C1-C20)alkyl(C6-C12) aryl, $R^2$ is hydrogen, (C1-C20)alkyl, halo(C1-C20)alkyl, (C6-C12)aryl, (C6-C12)aryl(C1-C20)alkyl, or (C1-C20) alkyl(C6-C12)aryl, n is an integer of 0 to 2, and the alkyl, aryl, arylalkyl, or alkylaryl of R, and the alkyl, haloalkyl, aryl, arylalkyl, or alkylaryl of $R^1$ may be further substituted with at least one substituent selected from halogen, hydroxyl, $-N(R^{11})(R^{12})$, and $-S(R^{13})$, where each of the $R^{11}$, the $R^{12}$ and the $R^{13}$ is independently hydrogen or (C1-C20)alkyl.

10 Claims, 17 Drawing Sheets

(51) Int. Cl.
*H01L 21/02* (2006.01)
*H01L 21/3213* (2006.01)
*C09K 13/06* (2006.01)
*C09K 13/00* (2006.01)

(52) U.S. Cl.
CPC .. *H01L 21/02532* (2013.01); *H01L 21/32133* (2013.01)

(56) References Cited

U.S. PATENT DOCUMENTS

| | | |
|---|---|---|
| 7,176,041 B2 | 2/2007 | Lee et al. |
| 8,778,210 B2 | 7/2014 | Cooper et al. |
| 2004/0209463 A1 | 10/2004 | Kim et al. |
| 2004/0242015 A1 | 12/2004 | Kim et al. |
| 2005/0132748 A1* | 6/2005 | Kuniyoshi ............. C03B 19/12 65/17.2 |
| 2005/0169096 A1 | 8/2005 | Lee et al. |
| 2005/0207723 A1* | 9/2005 | Hayashi ............. G02B 6/12004 385/144 |
| 2007/0082470 A1 | 4/2007 | Fitzgerald et al. |
| 2007/0111532 A1 | 5/2007 | Lee et al. |
| 2007/0138512 A1 | 6/2007 | Kanemoto |
| 2007/0190787 A1 | 8/2007 | Loubet et al. |
| 2010/0009188 A1* | 1/2010 | Xin ............. B05D 7/06 428/402 |
| 2013/0221279 A1* | 8/2013 | Xu ............. B82Y 30/00 252/301.36 |
| 2014/0004334 A1* | 1/2014 | Kalyankar ............. G02B 1/115 428/312.6 |
| 2014/0167108 A1 | 6/2014 | Rachmady et al. |
| 2016/0038940 A1* | 2/2016 | Babcock ............. B81C 1/00206 422/68.1 |
| 2016/0280955 A1* | 9/2016 | Olson ............. C08F 265/04 |
| 2017/0062428 A1 | 3/2017 | Cheng et al. |
| 2017/0111474 A1 | 4/2017 | Scott |
| 2018/0163130 A1 | 6/2018 | Kim et al. |
| 2018/0251370 A1* | 9/2018 | Maurer ............. B81C 1/0046 |

FOREIGN PATENT DOCUMENTS

| | | |
|---|---|---|
| KR | 10-2017-0057935 A | 5/2017 |
| KR | 10-1778893 B1 | 9/2017 |
| TW | 201821595 A | 6/2018 |

* cited by examiner

PRE-TREATMENT COMPOSITION BEFORE ETCHING SIGE AND METHOD OF FABRICATING SEMICONDUCTOR DEVICE USING THE SAME

CROSS-REFERENCE TO RELATED APPLICATION

Korean Patent Application No. 10-2018-0030385, filed on Mar. 15, 2018, in the Korean Intellectual Property Office, and entitled: "Pre-Treatment Composition Before Etching SiGe and Method of Fabricating Semiconductor Device Using the Same," is incorporated by reference herein in its entirety.

BACKGROUND

1. Field

Embodiments relate to a pre-treatment composition for use before etching SiGe and a method of fabricating a semiconductor device using the same.

2. Description of the Related Art

As devices are continuously scaled down to achieve higher degrees of integration, new structures and processes therefor are being considered, as traditional MOS architectures may be approaching practical scaling limits.

SUMMARY

Embodiments are directed to a pre-treatment composition for use before etching SiGe, the composition including an acid, an alcohol, and a silane compound of the following Formula 1:

<Formula 1>

In Formula 1, R is (C3-C20)alkyl, (C6-C12)aryl, (C6-C12)aryl(C3-C20)alkyl, or (C3-C20)alkyl(C6-C12)aryl, $R^1$ is hydrogen, hydroxyl, halogen, (C1-C20)alkyl, halo(C1-C20)alkyl, (C6-C12)aryl, (C6-C12)aryl(C1-C20)alkyl, or (C1-C20)alkyl(C6-C12)aryl, $R^2$ is hydrogen, (C1-C20) alkyl, halo(C1-C20)alkyl, (C6-C12)aryl, (C6-C12)aryl(C1-C20)alkyl, or (C1-C20)alkyl(C6-C12)aryl, n is an integer of 0 to 2, and the alkyl, aryl, arylalkyl or alkylaryl of R, and the alkyl, haloalkyl, aryl, arylalkyl or alkylaryl of $R^1$ may be further substituted with one or more substituents selected from halogen, hydroxyl, $-N(R^{11})(R^{12})$ and $-S(R^{13})$, where each of the $R^{11}$, the $R^{12}$, and the $R^{13}$ is independently hydrogen or (C1-C20)alkyl.

Embodiments are also directed to a method of fabricating a semiconductor device that includes forming an insulation pattern, a silicon pattern, and a SiGe pattern on a semiconductor substrate; supplying a pre-treatment composition according to an embodiment to form a passivation layer on the insulation pattern; and etching the SiGe pattern using a SiGe etching composition.

BRIEF DESCRIPTION OF THE DRAWINGS

Features will become apparent to those of skill in the art by describing in detail example embodiments with reference to the attached drawings in which:

FIGS. 4A to 17A illustrate perspective views showing stages in a process of fabricating a semiconductor device in order according to an example embodiment; and FIGS. 4B to 17B illustrate cross-sectional views taken along lines A-A' and B-B' of FIGS. 4A to 17A, respectively.

DETAILED DESCRIPTION

Hereinafter, example embodiments will be explained in detail with reference to the accompanying drawings.

Figure 1:
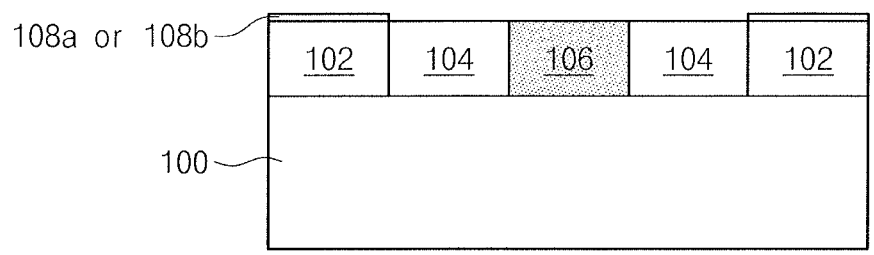
FIGS. 1 and 3 illustrate cross-sectional views of stages in a process of fabricating a semiconductor device according to an example embodiment.
Figure 2:
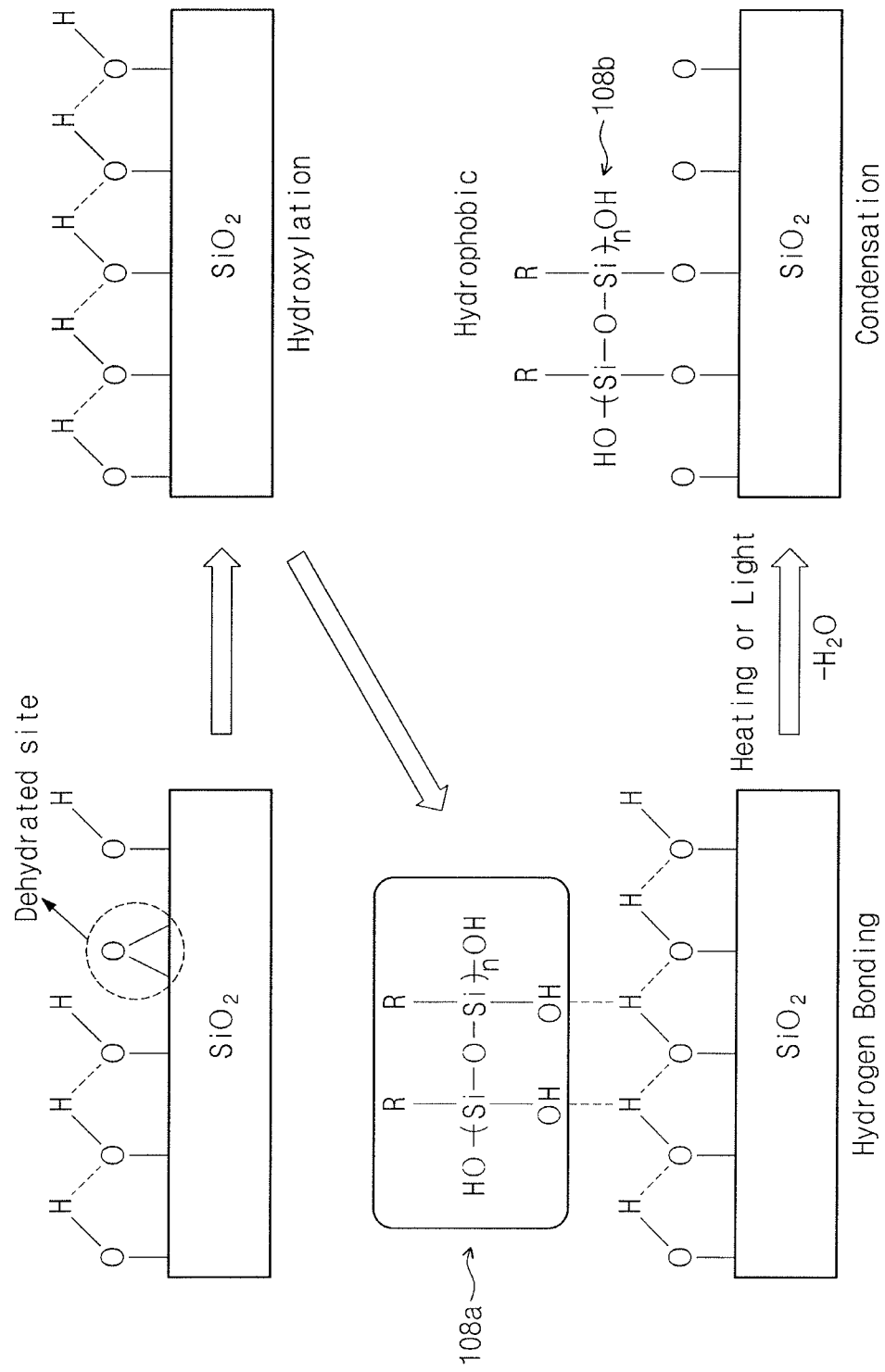
FIG. 2 illustrates a diagram showing the principal of action of a pre-treatment composition according to an example embodiment on the surface of a silicon oxide layer.
Figure 3:
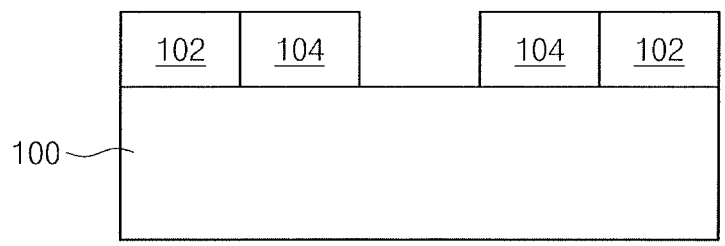

FIGS. 1 and 3 illustrate cross-sectional views of stages in a process of fabricating a semiconductor device in order according to an example embodiment. FIG. 2 illustrates a diagram of the principal of action of a pre-treatment composition according to an example embodiment on the surface of a silicon oxide layer.

Referring to FIG. 1, an insulation pattern 102, a silicon pattern 104, and a silicon germanium (SiGe) pattern 106 may be formed on a semiconductor substrate 100. The insulation pattern 102, the silicon pattern 104, and the SiGe pattern 106 may be formed by a deposition process, an etching process, etc. The insulation pattern 102 may be at least one of a silicon oxide layer, a silicon nitride layer, a silicon oxynitride layer, or a metal oxide layer. For example, the insulation pattern 102 may be formed as a silicon oxide layer.

According to an example embodiment, a pre-treatment composition may be supplied onto the semiconductor substrate 100 to form passivation layers 108a and 108b on the insulation pattern 102. The passivation layers 108a and 108b may be formed only on the insulation pattern 102, and may not form on the surfaces of the silicon pattern 104 and the SiGe pattern 106 due to a chemical reaction between the pre-treatment composition and the surface of the insulation pattern 102.

According to the present example embodiment, the pre-treatment composition may include an acid, an alcohol, and a silane compound of Formula 1 below.

<Formula 1>

In Formula 1, R may be (C3-C20)alkyl, (C6-C12)aryl, (C6-C12)aryl(C3-C20)alkyl, or (C3-C20)alkyl(C6-C12)aryl, $R^1$ may be hydrogen, hydroxyl, halogen, (C1-C20) alkyl, halo(C1-C20)alkyl, (C6-C12)aryl, (C6-C12)aryl(C1-C20)alkyl, or (C1-C20)alkyl(C6-C12)aryl, $R^2$ may be hydrogen, (C1-C20)alkyl, halo(C1-C20)alkyl, (C6-C12) aryl, (C6-C12)aryl(C1-C20)alkyl, or (C1-C20)alkyl(C6-C12)aryl, n may be an integer of 0 to 2, and the alkyl, aryl, arylalkyl, or alkylaryl of R, and the alkyl, haloalkyl, aryl, arylalkyl, or alkylaryl of $R^1$ may be further substituted with one or more substituents selected from halogen, hydroxyl, $-N(R^{11})(R^{12})$ and $-S(R^{13})$, where each of the $R^{11}$, the $R^{12}$ and the $R^{13}$ may independently be hydrogen or (C1-C20) alkyl.

In the pre-treatment composition, the acid may be included in an amount of about 0.01 wt % to about 20 wt %, the alcohol may be included in an amount of about 1 wt % to about 90 wt %, and the silane compound may be included in an amount of about 0.01 wt % to about 5 wt %. The pre-treatment composition may further include de-ionized water in an amount of 0 wt % to about 98.98 wt %. For example, in the pre-treatment composition, the acid may be included in an amount of about 0.01 wt % to about 10 wt %, the alcohol may be included in an amount of about 10 to about 70 wt %, and the silane compound may be included in an amount of about 0.01 wt % to about 3 wt %. The de-ionized water may be included in an amount of about 17 wt % to about 89.98 wt %. For example, in the pre-treatment composition, the acid may be included in an amount of about 0.01 wt % to about 5 wt %, the alcohol may be included in an amount of about 30 wt % to about 70 wt %, and the silane compound may be included in an amount of about 0.05 wt % to about 1 wt %. The de-ionized water may be included in an amount of about 24 wt % to about 69.94 wt %.

For example, in Formula 1, R may be (C3-C20)alkyl, halo(C3-C20)alkyl, or (C6-C12)aryl, and each of $R^1$ and $R^2$ may be independently hydrogen, (C1-C20)alkyl, or (C6-C12)aryl.

For example, in Formula 1, $R^2$ may be (C1-C20)alkyl and n may be 0.

The silane compound may include a compound represented by one of Formulae (1-1) to (1-7) below.

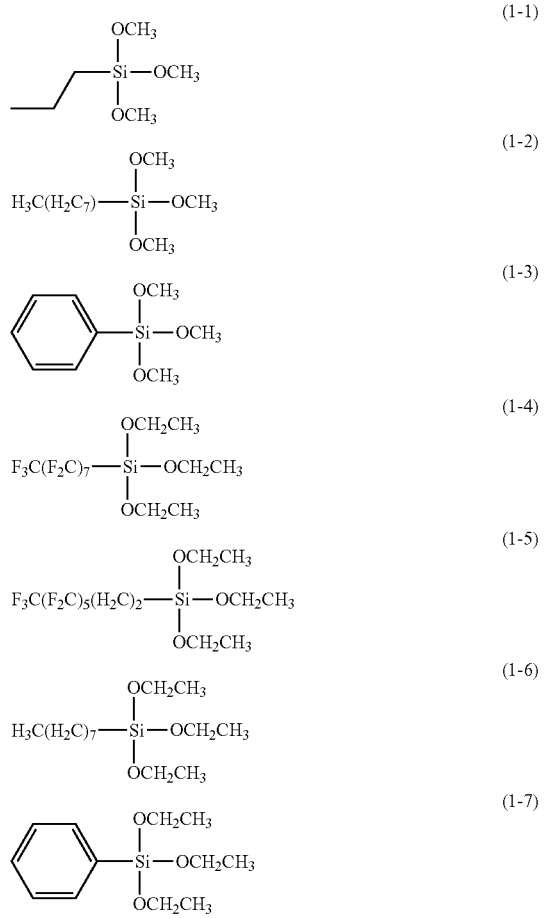

In the description, "alkyl", "alkoxy" and other substituents including an "alkyl" part may include both linear and branched types and may have 1-20 carbon atoms, for example, 1-15 carbon atoms, for example, 1-10 carbon atoms.

In the description, "aryl" is an organic functional group of an aromatic hydrocarbon from which one hydrogen atom is removed, and may have a monocyclic or fused cyclic structure including appropriately 4-7 ring-forming carbon atoms, for example, 5 or 6 ring-forming carbon atoms in each ring. In addition, "aryl" in the description may include a structure wherein aryl groups are connected via a single bond, without limitation.

In the description, "arylalkyl" may be alkyl of which one or more hydrogen atoms are substituted with aryl groups (particularly, with benzyl groups, without limitation). In the description, "arylhaloalkyl" may mean alkyl of which one or more hydrogen atoms are substituted with haloaryl groups. In the description, "haloalkyl" may mean alkyl of which one or more hydrogen atoms are substituted with halogen groups, particularly, with trifluoromethyl groups, without limitation.

The acid may be an inorganic acid, an organic acid, or a mixture thereof. For example, the acid may include one or more of hydrofluoric acid, hydrochloric acid, boric acid, sulfuric acid, nitric acid, phosphoric acid, hydrogen peroxide, acetic acid, propionic acid, diacetic acid, formic acid, butanoic acid, citric acid, glycolic acid, oxalic acid, malonic acid, pentanoic acid, tartaric acid, gluconic acid, succinic acid, iminodiacetic acid, methanesulfonic acid, ethanesulfonic acid, lactic acid, ascorbic acid, valeric acid, butyl acetic acid, enanthic acid, capric acid, malic acid, maleic acid, glutaric acid, adipic acid, D-gluconic acid, itaconic acid, citraconic acid, mesaconic acid, 2-oxoglutaric acid, trimellitic acid, endothal, glutamic acid, or methylsuccinic acid. For example, the acid may be sulfuric acid or acetic acid.

The alcohol may be a primary alcohol, a secondary alcohol, a tertiary alcohol, or a mixture thereof. For example, the alcohol may include one or more of methanol, ethanol, propanol, isopropanol, butanol, isobutanol, t-butanol, 2-methoxyethanol, 1-methoxy-2-propanol, 3-methoxy-1-butanol, pentanol, hexanol, 2-ethyl-1-hexanol, heptanol, octanol, ethylene glycol, propylene glycol, butylene glycol, hexylene glycol, tetrahydrofurfuryl alcohol, 1,2-butanediol, or 1,4-butanediol. For example, the alcohol may be one or more of methanol, ethanol, propanol, isopropanol, butanol, and isobutanol.

Without being bound by theory, referring to FIG. 2, in case where the insulation pattern 102 is formed using a silicon oxide layer, —OH groups may be present on the surface of the silicon oxide layer, and among them, dehydrated sites may be present. In this case, if the pre-treatment composition is supplied onto the semiconductor substrate 100, acids included in the pre-treatment composition may provide the dehydrated sites with hydrogen atoms for carrying out hydroxylation. Alcohols included in the pre-treatment composition may assist the thorough dissolution of the silane compound in the pre-treatment composition. The silane compound thus dissolved may combine via hydrogen bonding with hydrogen of the hydroxylated silicon oxide layer. Thus, silane compound may form a first passivation layer 108a.

In order to reinforce the bonding force between the silane compound and the silicon oxide layer, heating or light irradiation may be additionally performed with respect to the first passivation layer 108a. The heating process may be performed at, for example, a temperature of about 70° C. to about 200° C. for about 0.1 minutes to about 30 minutes, for example, at a temperature of about 80° C. to about 120° C. for about 0.5 minutes to about 3 minutes. The light irradiation may be performed with light having a wavelength of about 100 nm to about 400 nm for about 0.1 minutes to about 30 minutes, for example, with light having a wavelength of about 200 nm to about 400 nm for about 0.5 minutes to about 3 minutes. A suitable light source used for light irradiation may be used. Ultraviolet light may be used for example.

In case where the heating or the light irradiation is performed, the —OH groups of the silane compound that forms the first passivation layer 108a and the hydrogen atoms of the —OH groups on the surface of the silicon oxide layer may combine in a condensation reaction to form water ($H_2O$), and the silane compound in a dehydroxylated state may combine via a covalent bond with the oxygen atom on the surface of the silicon oxide layer. The silane compound in such a state may form a second passivation layer 108b. The surfaces of the first passivation layer 108a and the second passivation layer 108b may be hydrophobic.

Referring to FIG. 3, in a state where the first passivation layer 108a or the second passivation layer 108b are formed, the SiGe pattern 106 may be etched by supplying a SiGe etching composition. Then, the SiGe pattern 106 may be entirely removed, and the surface of the semiconductor substrate 100 and the sidewall of the silicon pattern 104 may be exposed. The first passivation layer 108a and/or the second passivation layer 108b may be removed simultaneously.

The SiGe etching composition may include, for example, an acid, an oxidant, and de-ionized water. The SiGe etching composition may further include a surfactant.

For example, the acid included in the SiGe etching composition may include hydrofluoric acid and acetic acid. The oxidant may include, for example, at least one of peracetic acid (PAA) or nitric acid. The surfactant may include, for example, lauryl alcohol ethylene oxide.

Without being bound by theory, when such a SiGe etching composition is supplied, the oxidant included therein may bond to a germanium atom of SiGe to form germanium oxide, and the hydrofluoric acid included in the SiGe etching composition may react with germanium oxide ($GeO_x$) to form germanium fluoride (for example, $GeF_4$). Through this process, germanium atoms may be removed from SiGe. Germanium atoms may be removed from SiGe and silicon atoms may remain, and the remaining silicon atoms may combine with an oxidant to form silicon oxide. Similarly, silicon oxide may combine with hydrofluoric acid to form silicon fluoride ($SiF_4$) and dihydrogen-siliconfluoride ($H_2SiF_6$) or hexafluorosilicic acid. Through these processes, the SiGe pattern 106 may be etched. The acid, the oxidant, and the de-ionized water included in the SiGe etching composition are hydrophilic. Thus, reactivity with the surface of the first passivation layer 108a or the second passivation layer 108b, which is hydrophobic, may be reduced. Accordingly, the SiGe etching composition may be less likely to make contact with the insulation pattern 102 due to the first passivation layer 108a and/or the second passivation layer 108b, and etching of the insulation pattern 102 may be reduced.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Experimental Examples 1-6 and Comparative Examples 1-3

Experiments were performed as follows. First, pre-treatment compositions of the Examples and Comparative Examples were prepared to have various components as shown in Table 1. The pre-treatment compositions were prepared at about 25° C.

In Table 1, IPA means isopropyl alcohol, EtOH means ethyl alcohol.

The kinds of the silane compounds, 1-4, 1-6, and 1-7, correspond to the chemical structures explained above, that is, correspond to:

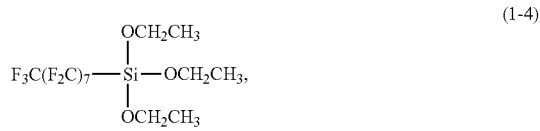

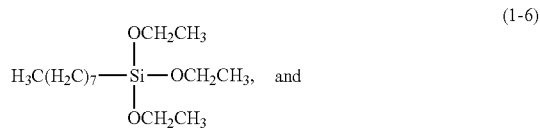

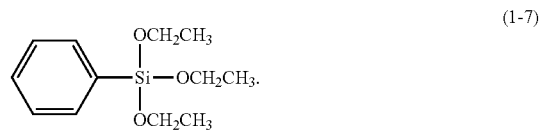

The change of etching results was checked by performing pre-treatment using the pre-treatment composition for use before etching SiGe. First, each of a polysilicon (p-Si) thin film, a silicon oxide ($SiO_2$) thin film and a silicon germanium (SiGe) thin film was formed on a bare wafer to prepare specimens. The thicknesses of the thin films in the prepared specimens were measured by using an ellipsometer (J. A. WOOLLAM Co., M-2000U).

Using the specimens of which thicknesses were measured, Experimental Examples and Comparative Examples were performed as follows. In Experimental Examples 1-6, specimens were pre-treated using a pre-treatment composition for about 1 minute, dried with nitrogen, treated using a SiGe etching composition for about 1 minute, washed with ultrapure water, and dried with nitrogen. Then, the thickness of each thin film was measured by using an ellipsometer and etching rates were computed. In Comparative Examples 1-3, the specimens were treated using a SiGe etching composition for about 1 minute without pre-treatment using a pre-treatment composition, washed with ultrapure water, and dried with nitrogen. Then, the thickness of each thin film was measured using an ellipsometer and etching rates were computed. Details are shown in Table 1.

Three kinds of SiGe compositions were prepared:

SiGe Etching Composition 1 included HF, PAA, acetic acid, and de-ionized water in a volume ratio of 1.5:30:30:30.

SiGe Etching Composition 2 was obtained by adding about 0.1 vol % of lauryl alcohol ethylene oxide as a non-ionic surfactant to SiGe Etching Composition 1.

SiGe Etching Composition 3 included about 41.3 wt % of nitric acid, about 0.6 wt % of hydrofluoric acid, about 2.1 wt % of acetic acid, and about 56 wt % of de-ionized water.

Experimental results on etching rates are shown in Table 1.

TABLE 1

| Experiment no. | Components of pre-treatment composition | | | | | | | | SiGe etchant no. | Etching rate (Å/min) | | |
|---|---|---|---|---|---|---|---|---|---|---|---|---|
| | Alcohol | | Acid | | Silane compound | | DI water | | | | | |
| | No. | Kind | wt % | Kind | wt % | Kind | wt % | wt % | | SiGe | p-Si | SiO$_2$ |
| Experimental Example 1 | 1 | IPA | 50 | Sulfuric acid | 0.1 | 1-6 | 0.1 | 49.8 | 1 | 505 | 4.1 | 20 |
| Experimental Example 2 | 2 | IPA | 50 | Sulfuric acid | 0.1 | 1-6 | 0.1 | 49.8 | 2 | 457 | 3.6 | 18 |
| Experimental Example 2-1 | 2-1 | IPA | 50 | Sulfuric acid | 0.1 | 1-6 | 0.1 | 49.8 | 3 | 5010 | 23 | 21 |
| Experimental Example 3 | 3 | IPA | 50 | Sulfuric acid | 0.1 | 1-7 | 0.1 | 49.8 | 1 | 508 | 4.4 | 22 |
| Experimental Example 4 | 4 | IPA | 50 | Sulfuric acid | 0.1 | 1-4 | 0.1 | 49.8 | 1 | 503 | 4.0 | 18 |
| Experimental Example 5 | 5 | IPA | 50 | Acetic acid | 1 | 1-6 | 0.1 | 48.9 | 1 | 507 | 4.2 | 19 |
| Experimental Example 6 | 6 | EtOH | 50 | Sulfuric acid | 0.1 | 1-6 | 0.1 | 49.8 | 1 | 504 | 4.1 | 20 |
| Comparative Example 1 | — | — | — | — | — | — | — | — | 1 | 510 | 4.5 | 170 |
| Comparative Example 2 | — | — | — | — | — | — | — | — | 2 | 460 | 3.9 | 166 |
| Comparative Example 3 | — | — | — | — | — | — | — | — | 3 | 5120 | 25 | 172 |

Referring to Table 1, Experimental Examples 1-6 were found to show significantly lower etching rates with respect to silicon oxide than the Comparative Examples. On the other hand, the etching rate with respect to polysilicon (p-Si) or the etching rate with respect to silicon germanium (SiGe) were found to be almost the same or similar for the Comparative Examples and the Experimental Examples. Accordingly, if SiGe is etched after performing a pre-treatment process using the pre-treatment composition according to an example embodiment, SiGe may be selectively removed while minimizing the etching damage of silicon oxide layer and silicon.

Experimental Examples 7-9

In these experiments, effects accompanied with heating or light irradiation in a state of FIG. 2 with the first passivation layer 108 were examined. In these experiments, the same Pre-treatment Composition 1 used in Experimental Example 1 and SiGe Etching Composition 1 were used, and heating or light irradiation process was performed after performing the pre-treatment process using Pre-treatment Composition 1 before supplying SiGe Etching Composition 1. The heating was performed using a hot plate and the light irradiation was performed using an ultraviolet lamp. The results are shown in Table 2.

TABLE 2

| | Heating | Light irradiation | Etching rate (Å/min) | | |
|---|---|---|---|---|---|
| | | | SiGe | p-Si | SiO$_2$ |
| Experimental Example 1 | — | — | 505 | 4.1 | 20 |
| Experimental Example 7 | 100° C./60 sec | — | 490 | 3.7 | 0.2 |
| Experimental Example 8 | — | 365 nm/300 W/60 sec | 498 | 3.9 | 6 |
| Experimental Example 9 | — | 254 nm/16 W/60 sec | 501 | 3.9 | 9 |
| Comparative Example 1 | — | — | 510 | 4.5 | 170 |

Referring to Table 2, it was found that the etching rates with respect to a silicon oxide layer in Experimental Examples 7-9, in which heating or light irradiation was additionally performed, were decreased relative to Experimental Example 1. As a result, without being bound by theory, it is believed that the bonding force between the second passivation layer 108b of FIG. 2 and the surface of the silicon oxide layer became stronger than the first passivation layer 108a. In addition, it was found that if SiGe was etched after performing the pre-treatment process using the pre-treatment composition according to an example embodiment, SiGe may be selectively removed while minimizing the etching damage of a silicon oxide layer and silicon.

In the Experimental Examples below, pre-treatment compositions having various components in various ranges relative to the aforementioned Experimental Examples were prepared, and results obtained by applying these compositions were examined.

First, pre-treatment compositions were additionally prepared as in Table 3. In Table 3, silane compound 1-1 corresponds to:

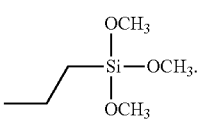

(1-1)

TABLE 3

| | | Components of pre-treatment composition | | | | | | | SiGe | Etching rate (Å/min) | | |
|---|---|---|---|---|---|---|---|---|---|---|---|---|
| Experimental | | Alcohol | | Acid | | Silane compound | | DI water | etchant | | | |
| Example no. | No. | Kind | wt % | Kind | wt % | Kind | wt % | wt % | no. | SiGe | p-Si | SiO$_2$ |
| 10 | 7 | IPA | 80 | Sulfuric | 0.1 | 1-6 | 2 | 17.9 | 1 | 436 | 3.1 | 0.06 |
| 11 | 8 | | 50 | acid | 1 | | 0.1 | 48.9 | | 484 | 3.6 | 0.17 |
| 12 | 9 | | 50 | | 5 | | 0.1 | 44.9 | | 470 | 3.4 | 0.11 |
| 13 | 10 | | 50 | Acetic acid | 10 | | 0.1 | 39.9 | | 486 | 3.6 | 0.23 |
| 14 | 11 | | 80 | Sulfuric | 1 | | 0.5 | 18.5 | | 460 | 3.6 | 0.16 |
| 15 | 12 | | 80 | acid | 1 | | 1 | 18 | | 448 | 3.3 | 0.09 |
| 16 | 13 | | 90 | | 1 | | 2 | 7 | | 436 | 3.1 | 0.06 |
| 17 | 14 | | 1 | | 0.01 | 1-1 | 0.01 | 98.98 | | 495 | 3.5 | 11.52 |
| 18 | 15 | | 10 | | 0.01 | | 0.05 | 89.94 | | 498 | 3.7 | 6.60 |
| 19 | 16 | | 50 | | 0.1 | | 1 | 48.9 | | 485 | 3.3 | 4.13 |
| 20 | 17 | | 50 | Acetic acid | 20 | | 5 | 25 | | 483 | 3.4 | 14.70 |

In Experimental Examples 10-20, after supplying the pre-treatment composition as for Experimental Example 7, heating was performed using a hot plate at conditions of 100° C./60 sec, and an etching process was performed using SiGe Etchant 1 for about 1 minute, and then an etching rate was obtained.

Referring to Table 3, the results obtained by applying the pre-treatment compositions according to the Examples showed remarkably lower etching rates with respect to the silicon oxide layer than Comparative Examples 1-3. In addition, from Experimental Examples 1-20, it was found that excellent effects were obtained if the pre-treatment process was performed using the pre-treatment composition according to an example embodiment having about 0.01 wt % to about 20 wt % of an acid, about 1 wt % to about 90 wt % of an alcohol and about 0.01 wt % to about 5 wt % of a silane compound when compared to the Comparative Examples.

Now, a method of fabricating a semiconductor device having a multibridge-channel (MBC) MOSFET structure by using the pre-treatment composition according to an example embodiment will be described.

FIGS. 4A to 17A illustrate perspective views of stages in a process of fabricating a semiconductor device in order according to an example embodiment.

FIGS. 4B to 17B illustrate cross-sectional views taken along lines A-A' and B-B' of FIGS. 4A to 17A, respectively.

Figure 4A:
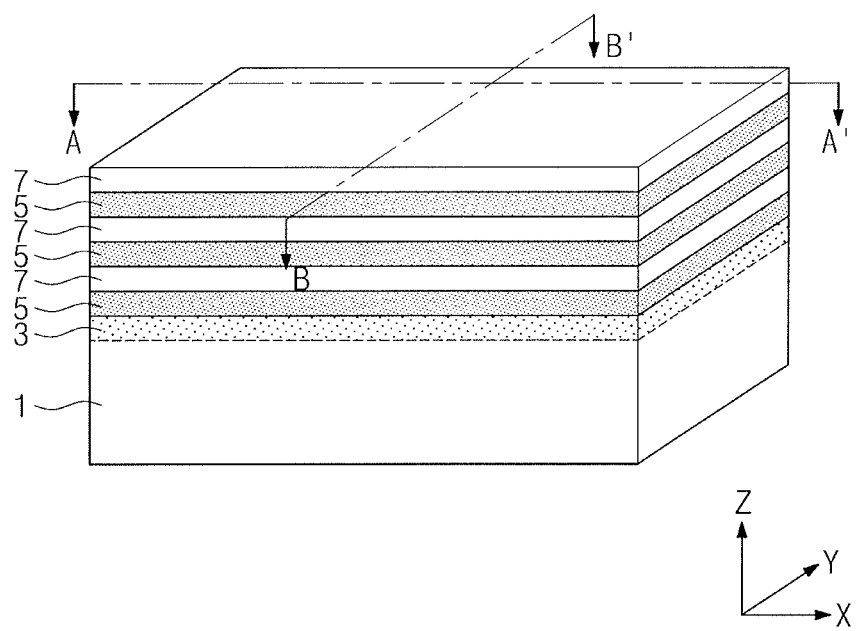
Figure 4B:
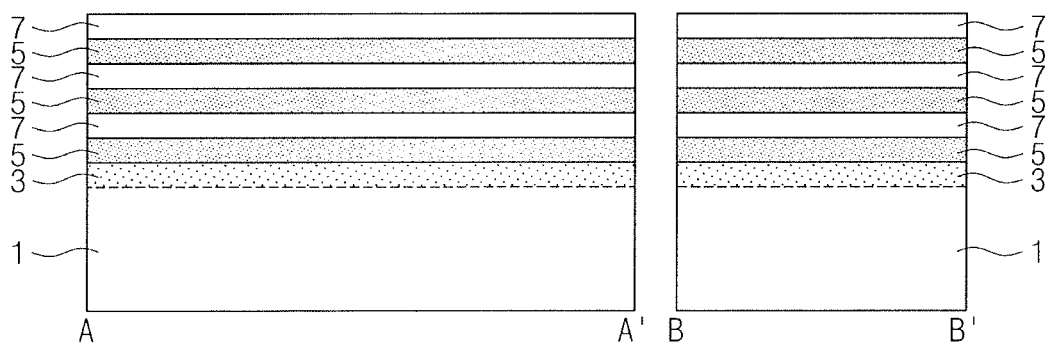

Referring to FIGS. 4A and 4B, a semiconductor substrate 1 is prepared. The semiconductor substrate 1 may be formed using silicon single crystal or may be a silicon on insulator (SOI) substrate. A well region doped with first conductive type impurities may be formed in the semiconductor substrate 1. A channel stop region 3 may be formed in a region adjacent to the surface of the semiconductor substrate 1. The channel stop region 3 may be formed by, for example, an ion implantation process. The channel stop region 3 may be doped with, for example, the first conductive type impurities. The concentration of the impurities in the channel stop region 3 may be higher than the well region. On the semiconductor substrate 1, SiGe layers 5 and silicon layers 7 may be alternately stacked. The SiGe layers 5 and the silicon layers 7 may be formed by a deposition process.

Figure 5A:
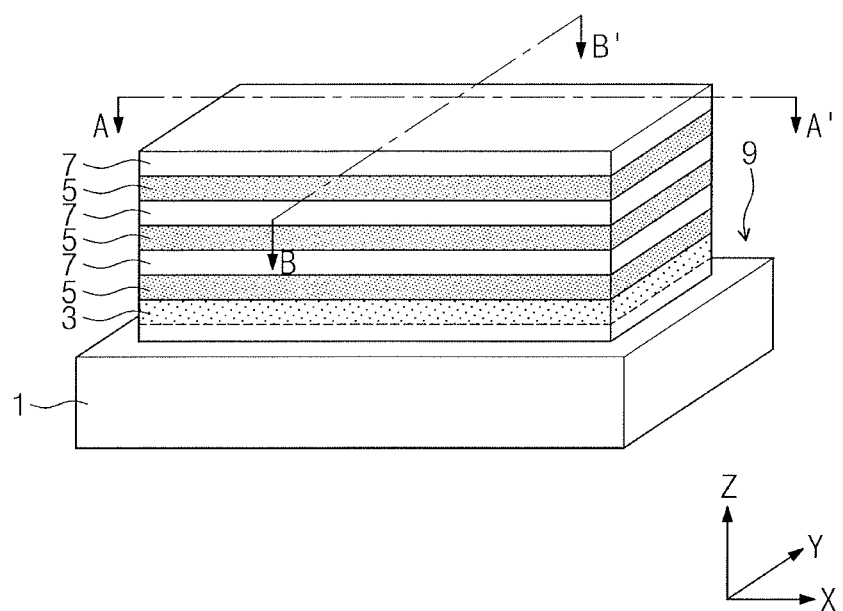
Figure 5B:
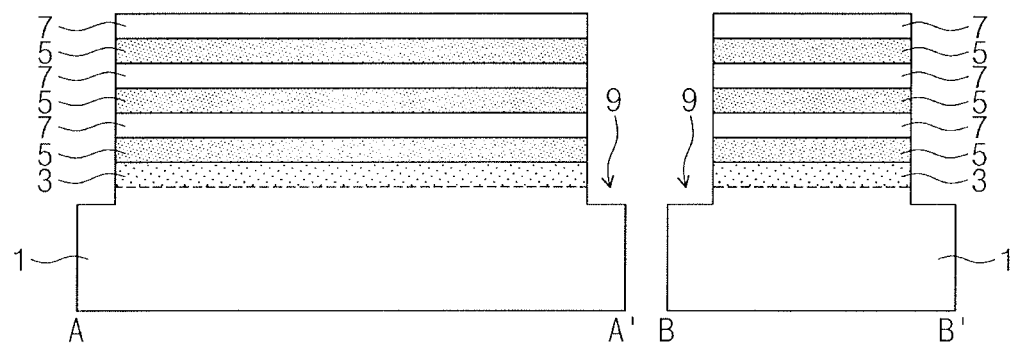

Referring to FIGS. 5A and 5B, the silicon layers 7 and the SiGe layers 5 may be patterned sequentially to form a first trench 9 exposing the semiconductor substrate 1. The channel stop region 3 may be also patterned and the channel stop region 3 may be exposed to the sidewall of the first trench 9. The process of patterning the silicon layers 7 and the SiGe layers 5 sequentially may be performed by an anisotropic etching process.

Figure 6A:
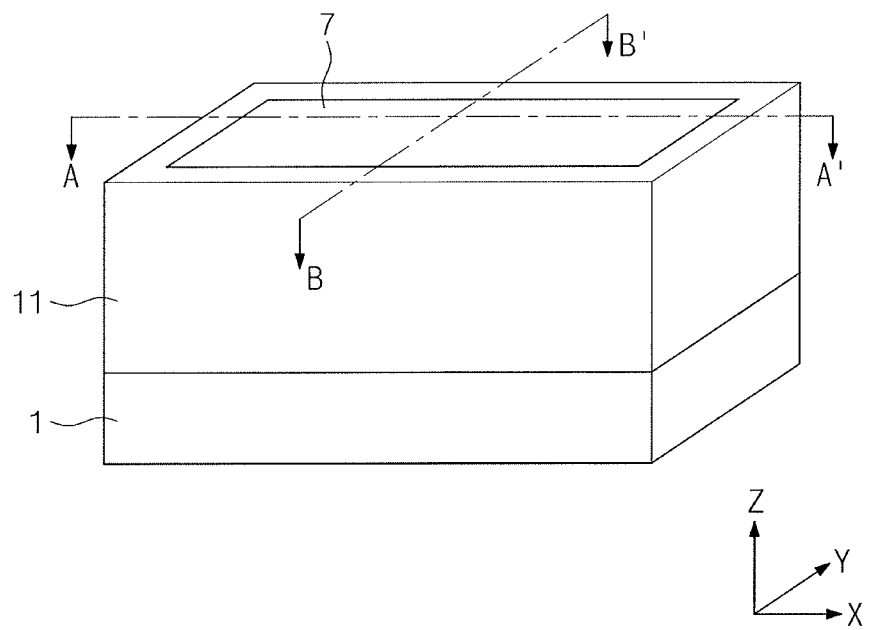
Figure 6B:
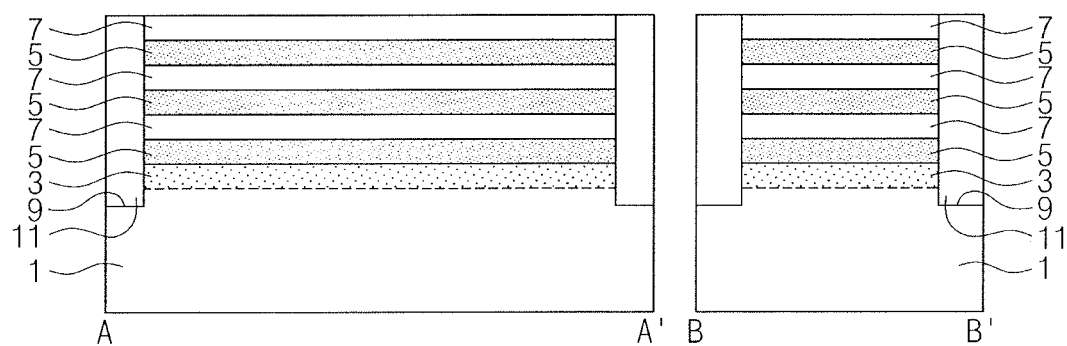

Referring to FIGS. 6A and 6B, an insulating layer may be stacked to fill the first trench 9, and a planarization process may be performed to expose the uppermost silicon layer 7 among the silicon layers 7 and to form a device isolation layer 11 in the first trench 9 at the same time. The device isolation layer 11 may include, for example, a silicon oxide layer. Though not shown, between the device isolation layer 11 and the sidewall and bottom surface of the first trench 9, an insulating layer liner may be interposed. The insulating layer liner may include, for example, a silicon nitride layer.

Figure 7A:
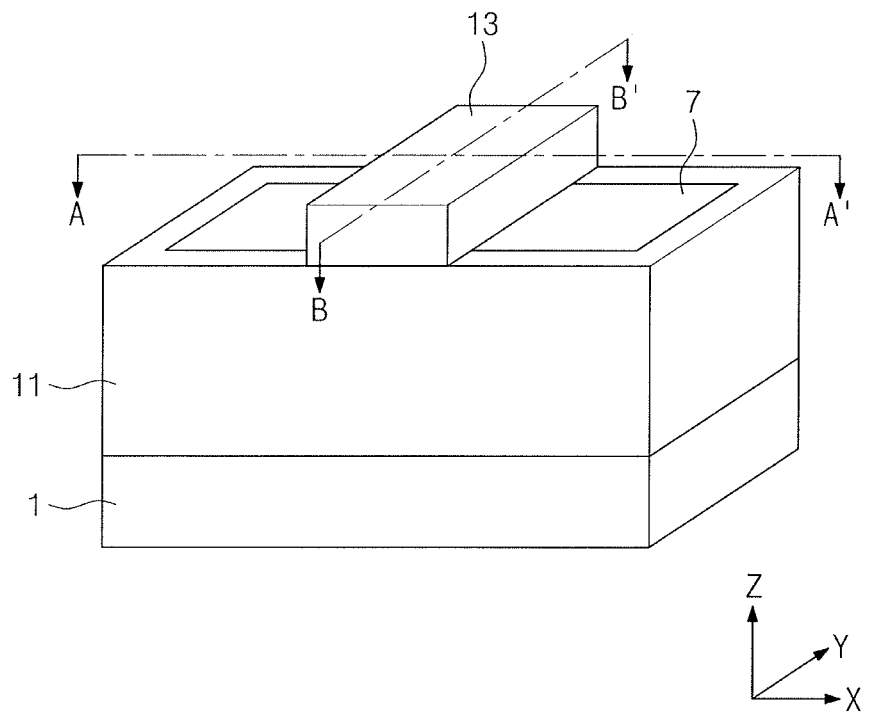
Figure 7B:
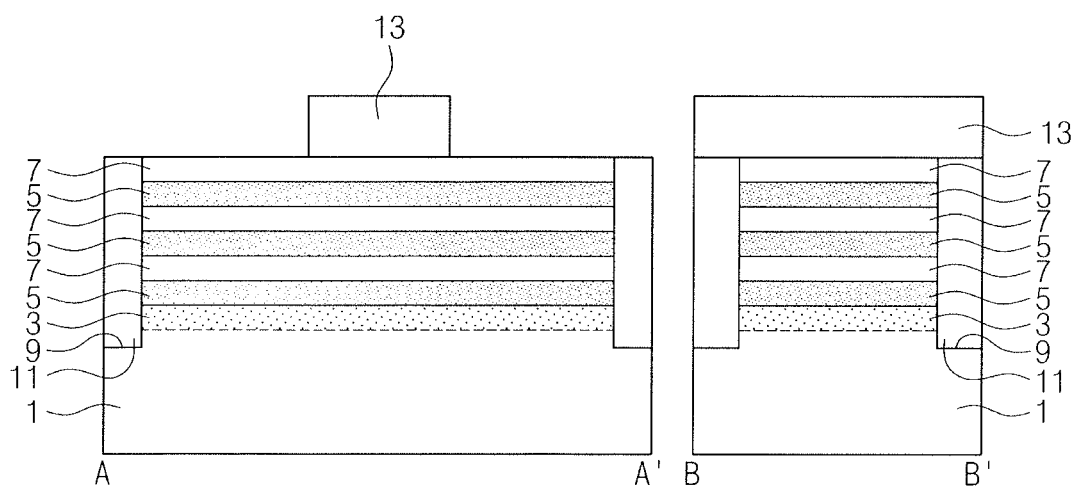

Referring to FIGS. 7A and 7B, a first mask pattern 13 may be formed to cross the device isolation layer 11 and the silicon layer 7 in a second direction (y). The first mask pattern 13 may be long in the second direction (y). The first mask pattern 13 may be composed of layers having different etching rates from each other. For example, the first mask pattern 13 may include at least one of a silicon nitride layer, a silicon oxide layer, a spin on hardmask (SOH), a spin on carbon (SOC), an amorphous carbon layer (ACL), and a photoresist pattern. At both sides (in a first direction (x)) of the first mask pattern 13, the top of the silicon layer 7 may be exposed.

Figure 8A:
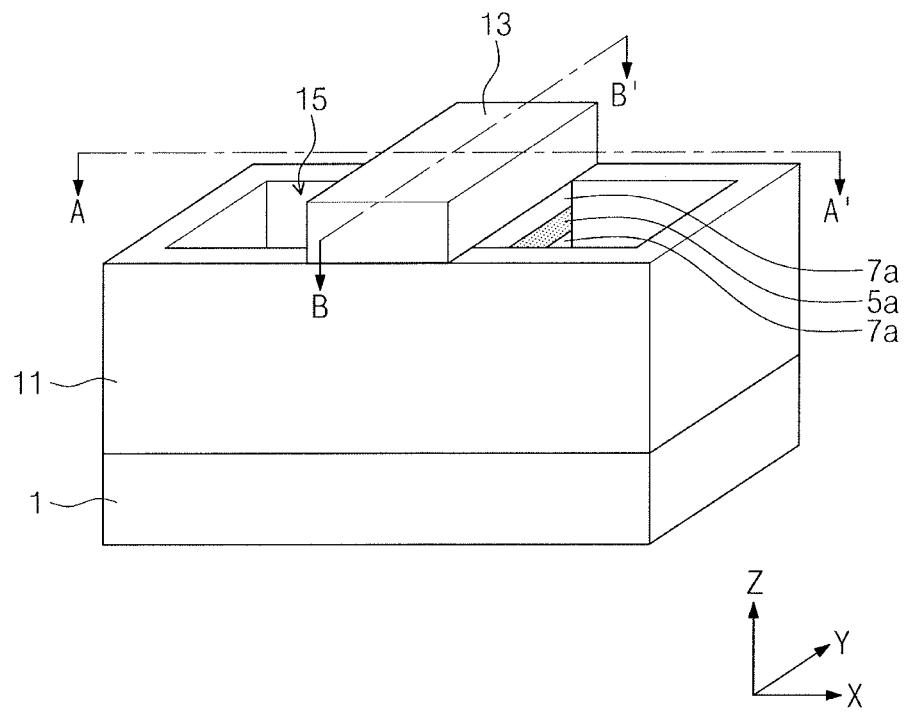
Figure 8B:
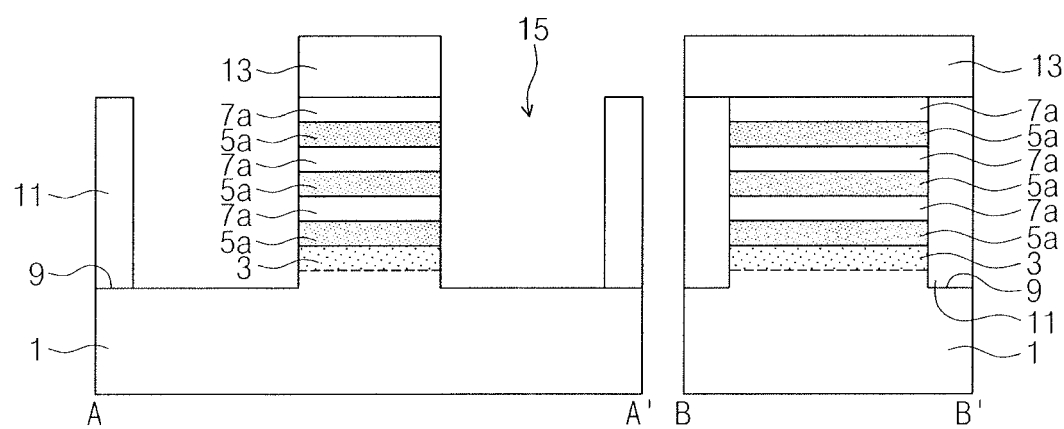

Referring to FIGS. 8A and 8B, the silicon layers 7 and the SiGe layers 5 at both sides of the first mask pattern 13 may be etched sequentially using the first mask pattern 13 as an etching mask to form second trenches 15. The channel stop region 3 may be also patterned. Due to this, the top portion of the semiconductor substrate 1 may be partially recessed. Through this process, alternately stacked SiGe patterns 5a and silicon patterns 7a may be formed. By the second trenches 15, the sidewall of the device isolation layer 11 may be exposed.

Figure 9A:
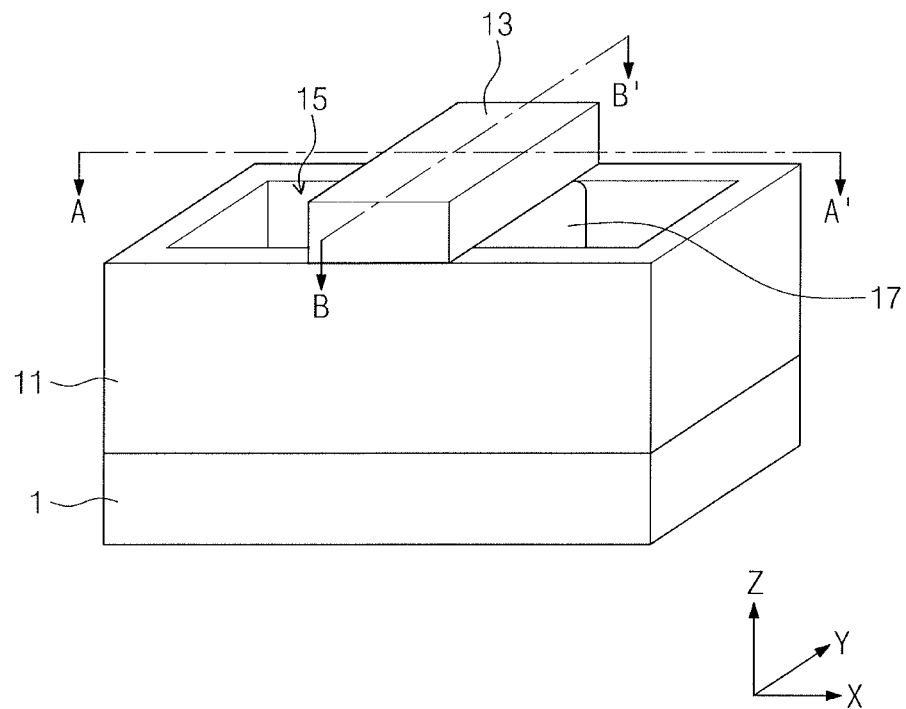
Figure 9B:
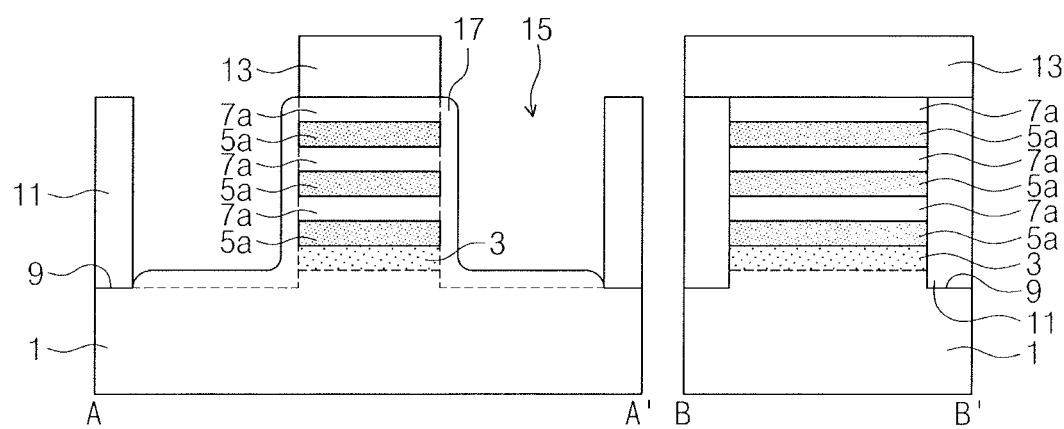

Referring to FIGS. 9A and 9B, a selective epitaxial growth (SEG) process may be performed to form a silicon epitaxial layer 17 on the inner sidewall and bottom of the second trench 15. The silicon epitaxial layer 17 may be formed on the sidewalls of the SiGe patterns 5a and the silicon patterns 7a and on the recessed surface of the semiconductor substrate 1. The silicon epitaxial layer 17 may cover the sidewall of the channel stop region 3. The boundary between the silicon epitaxial layer 17 and the silicon patterns 7a may not be distinguished. The silicon epitaxial layer 17 may not be formed on the device isolation layer 11.

Figure 10A:
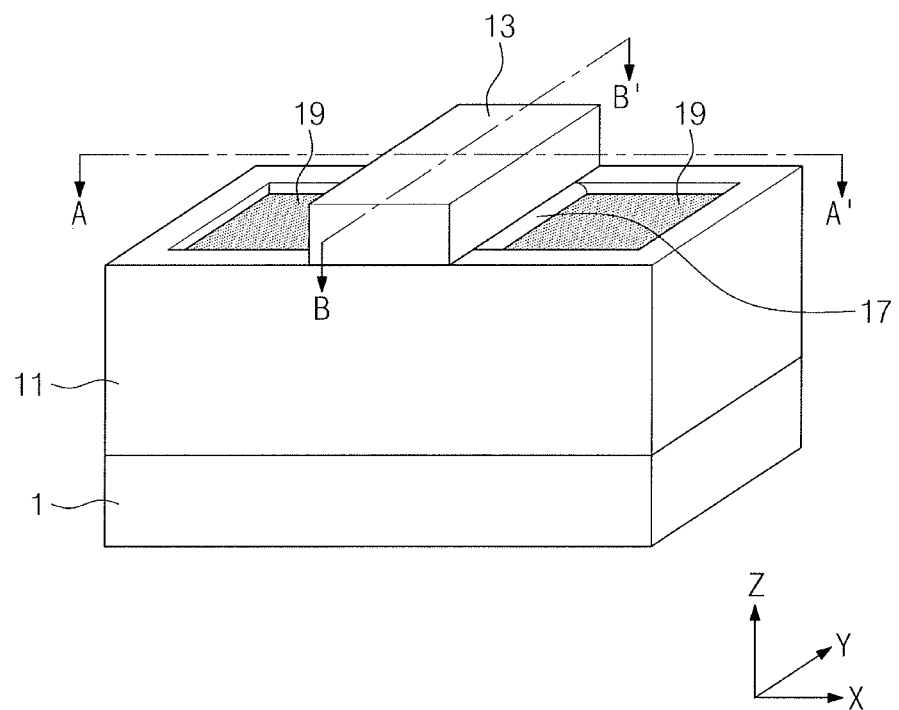
Figure 10B:
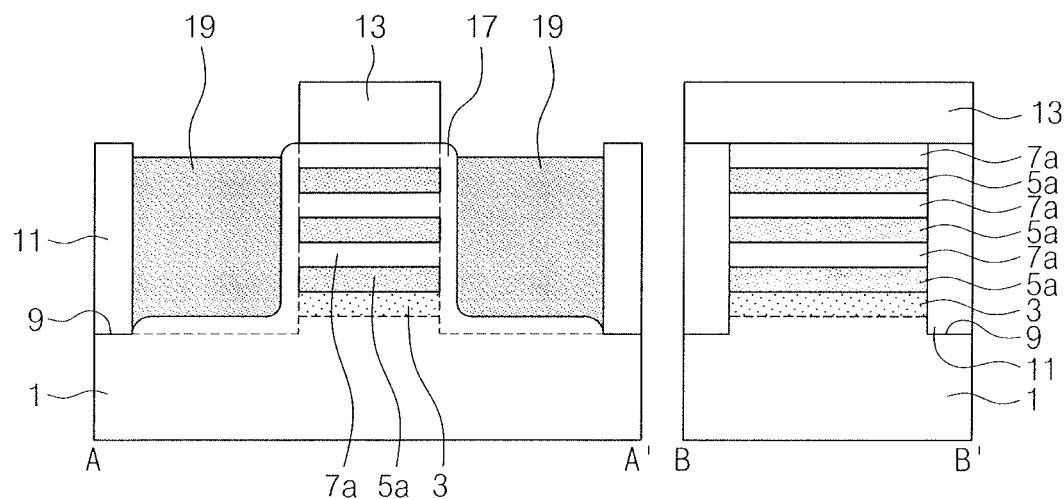

Referring to FIGS. 10A and 10B, a polysilicon layer may be stacked on the semiconductor substrate 1 to fill the second trenches 15, and anisotropic etching may be performed to form source/drain patterns 19 in the second trenches 15. The source/drain patterns 19 may be formed as polysilicon layers doped with impurities. The impurities doped into the source/drain patterns 19 may be implanted by performing an ion implantation process after the anisotropic etching process, or may be supplied during stacking the polysilicon layer in situ.

Figure 11A:
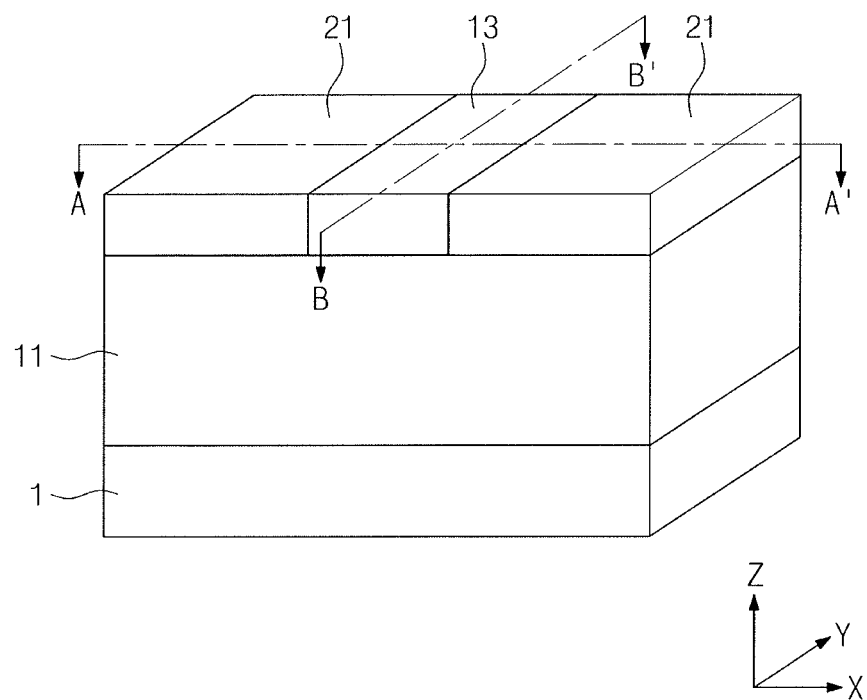
Figure 11B:
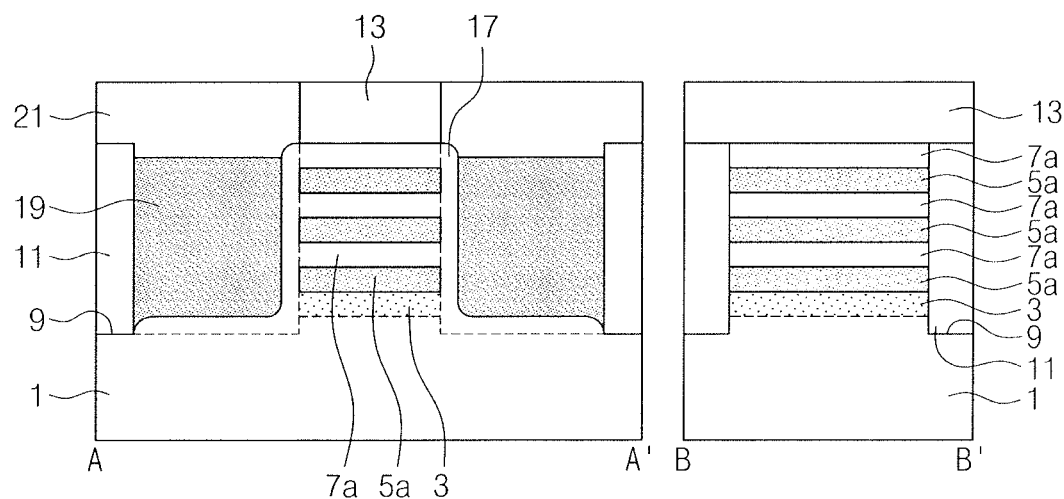

Referring to FIGS. 11A and 11B, a mask layer may be stacked on the semiconductor substrate 1, and a planarization process may be performed to expose the top of the first mask pattern 13 and to form second mask patterns 21 at both sides of the first mask pattern 13 at the same time. The second mask patterns 21 may be formed using a material having a different etching selectivity from the first mask pattern 13. In addition, the second mask patterns 21 may be formed using a material having a different etching selectivity from the device isolation layer 11. For example, the first mask pattern 13 may be formed using a silicon oxide layer and the second mask patterns 21 may be formed using a silicon nitride layer.

Figure 12A:
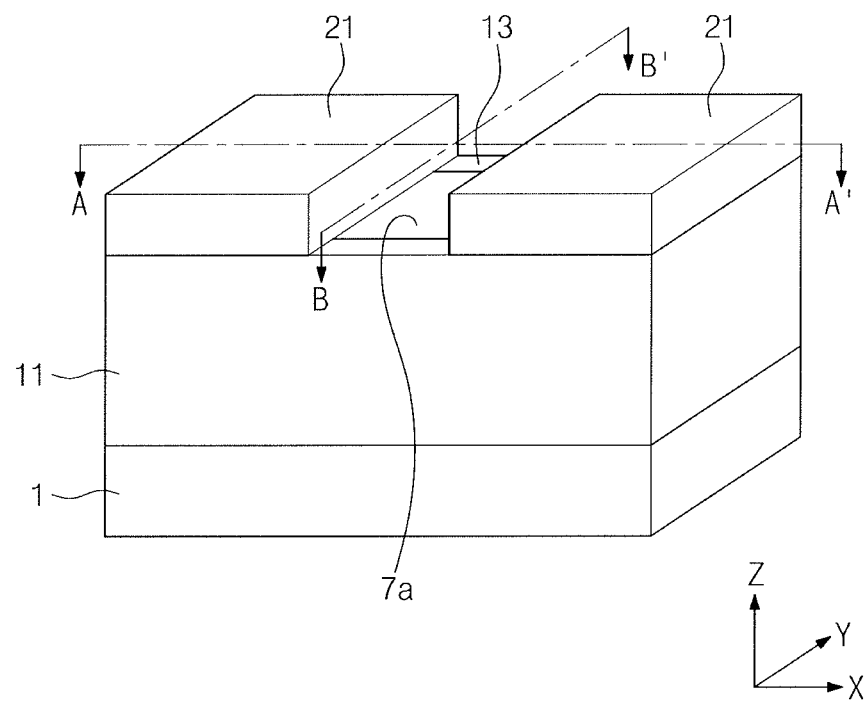
Figure 12B:
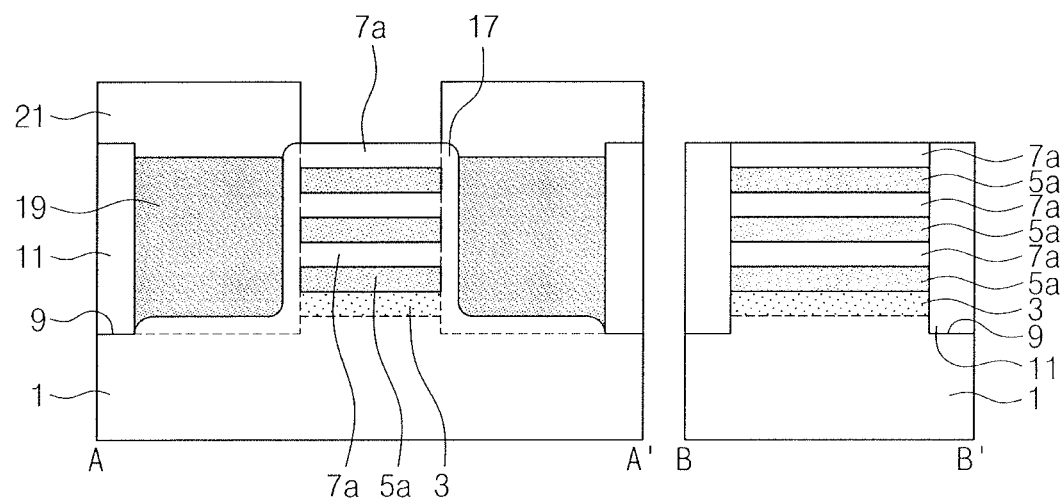

Referring to FIGS. 12A and 12B, the first mask pattern 13 may be removed to expose the tops of the silicon pattern 7a and the device isolation layer 11 between the second mask patterns 21. As described above, the second mask patterns 21 may be formed by a self-alignment method, and misalignment problems of the second mask patterns 21 may be avoided.

On the other hand, without the processes of FIGS. 11A and 11B, the first mask pattern 13 may be removed prior to forming the second mask patterns 21 and then, the second mask patterns 21 may be formed via a photolithography process and an etching process.

Figure 13A:
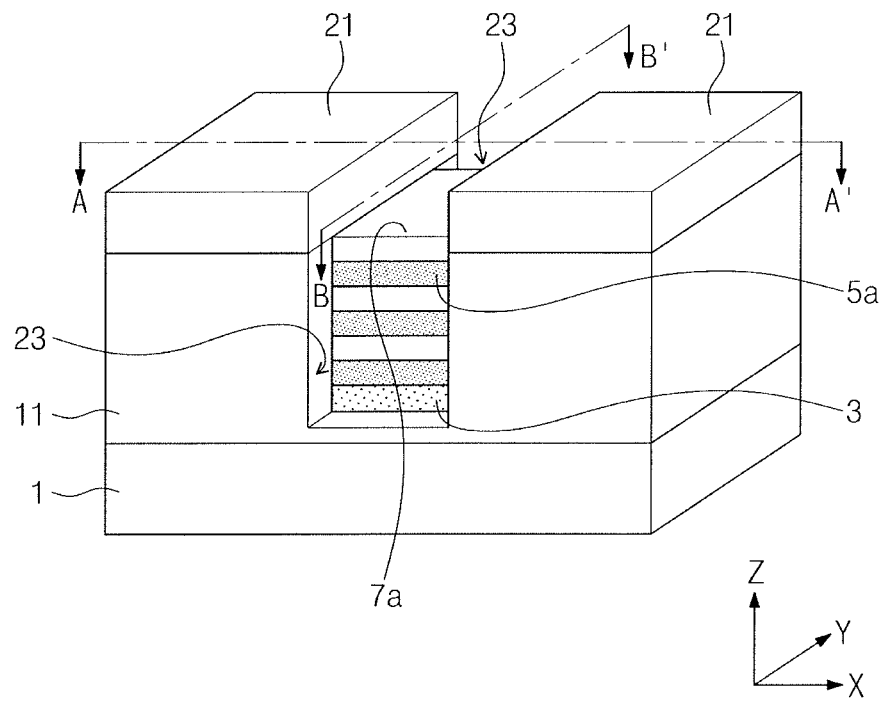
Figure 13B:
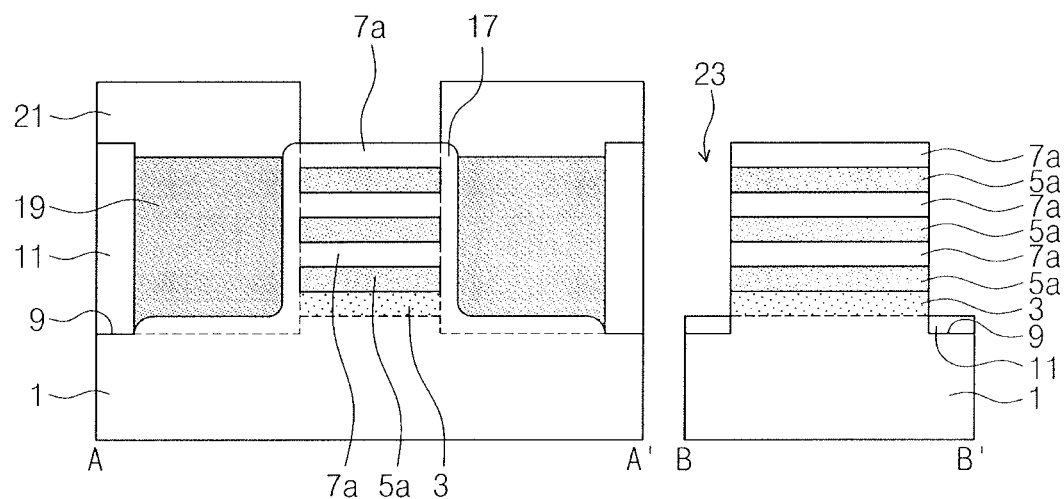

Referring to FIGS. 13A and 13B, the device isolation layer 11 exposed between the second mask patterns 21 may be etched to form openings 23. In the openings 23, the sidewalls of the silicon patterns 7a and the SiGe patterns 5a may be exposed in the second direction (y). The sidewall of the semiconductor substrate 1 on which the channel stop region 3 is disposed may be exposed. On the bottom of the opening 23, the device isolation layer 11 may remain.

Figure 14A:
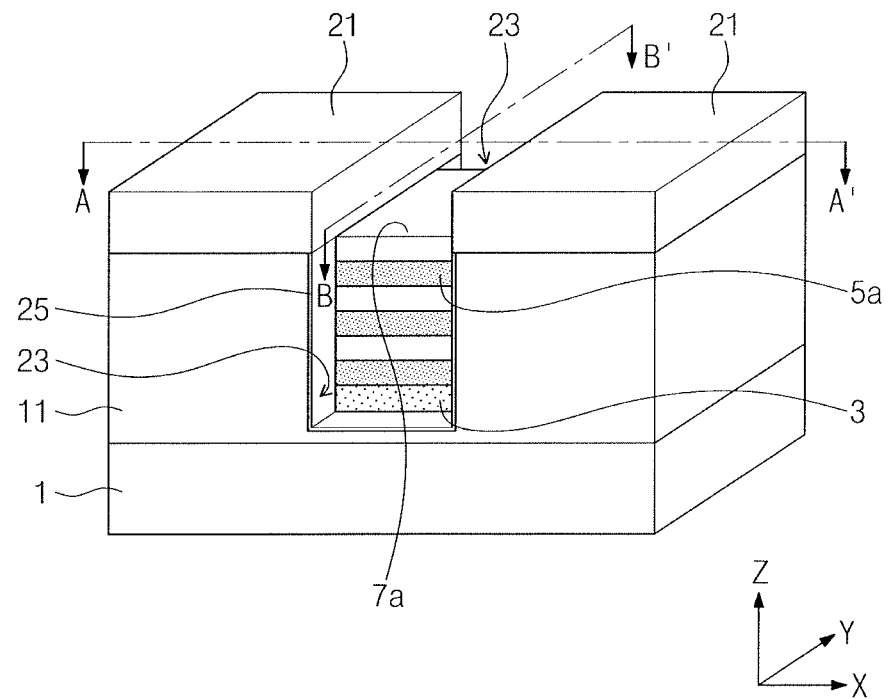
Figure 14B:
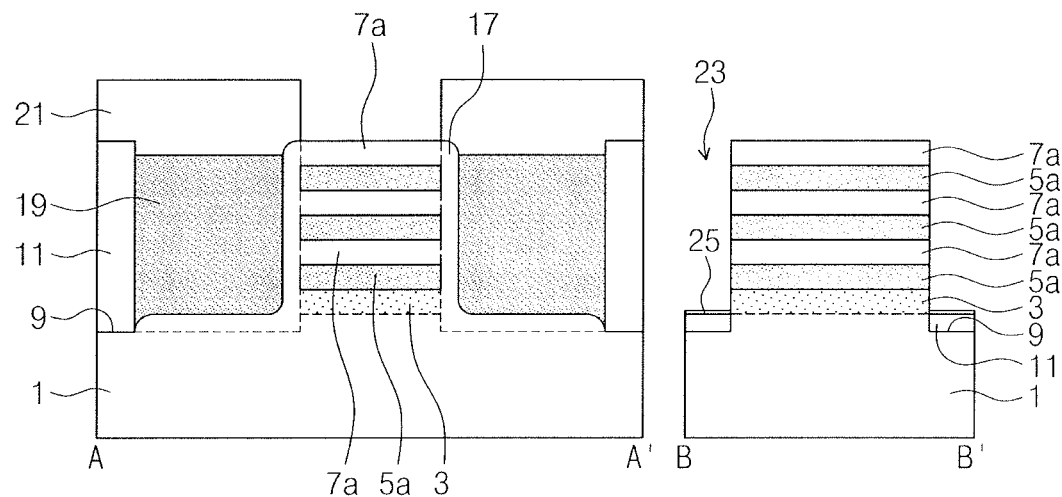

Referring to FIGS. 14A and 14B, a pre-treatment composition explained referring to FIGS. 1 to 3 may be supplied to form a passivation layer 25 on the surface of the device isolation layer 11. In order to increase the bonding force between the passivation layer 25 and the surface of the device isolation layer 11, a heating or light irradiation process may be additionally performed. The passivation layer 25 may not form on the surfaces of the silicon patterns 7a and the SiGe patterns 5a. The processes of FIGS. 1 and 2 according to an example embodiment may correspond to FIGS. 14A and 14B.

Figure 15A:
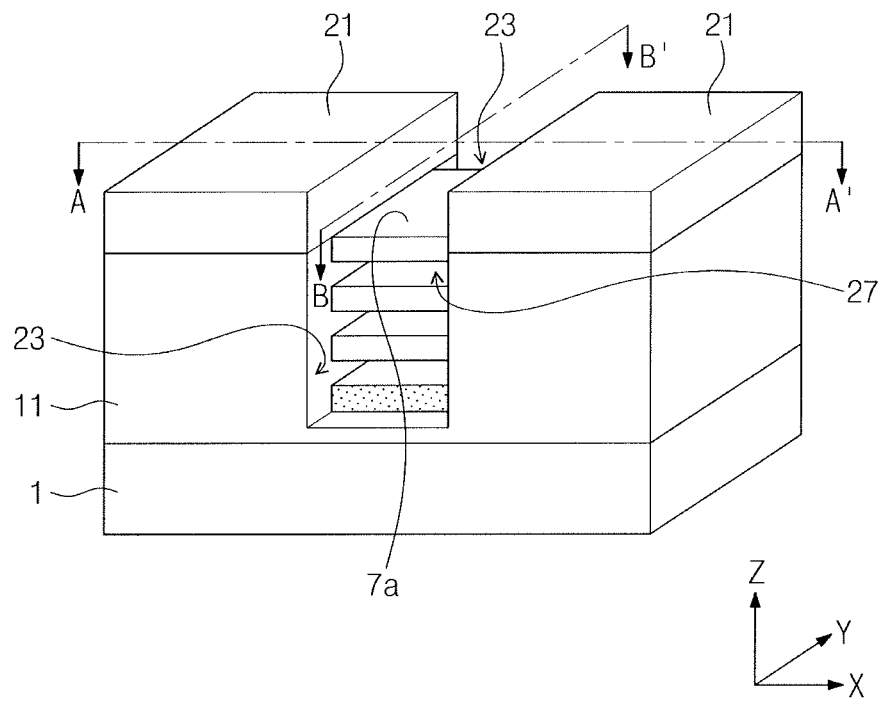
Figure 15B:
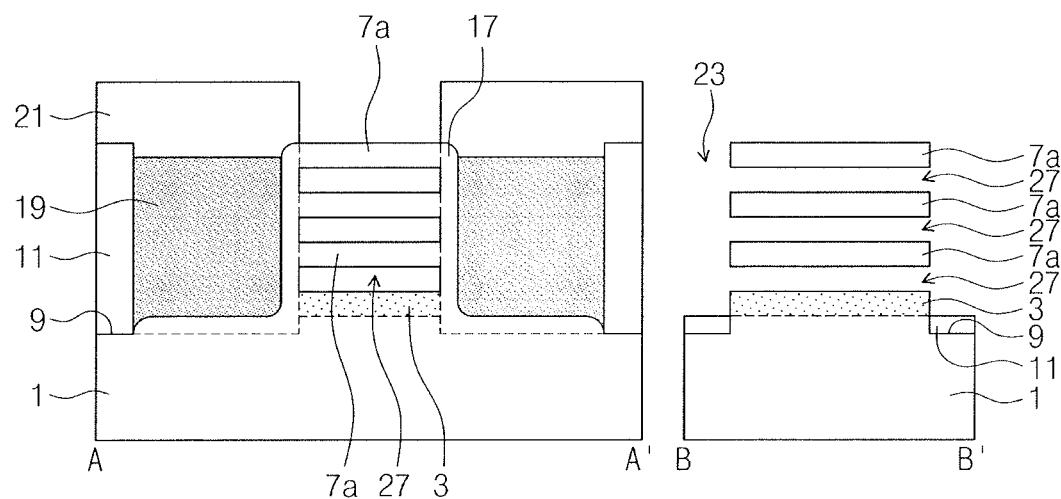

Referring to FIGS. 15A and 15B, a SiGe etching composition may be supplied to etch and remove the SiGe patterns 5a and to expose the surfaces of the silicon patterns 7a and the surface of the semiconductor substrate 1. Thus, empty spaces 27 may be formed between the silicon patterns 7a. The passivation layer 25 may be also removed. The process of FIG. 3 according to an example embodiment may correspond to FIGS. 15A and 15B.

Figure 16A:
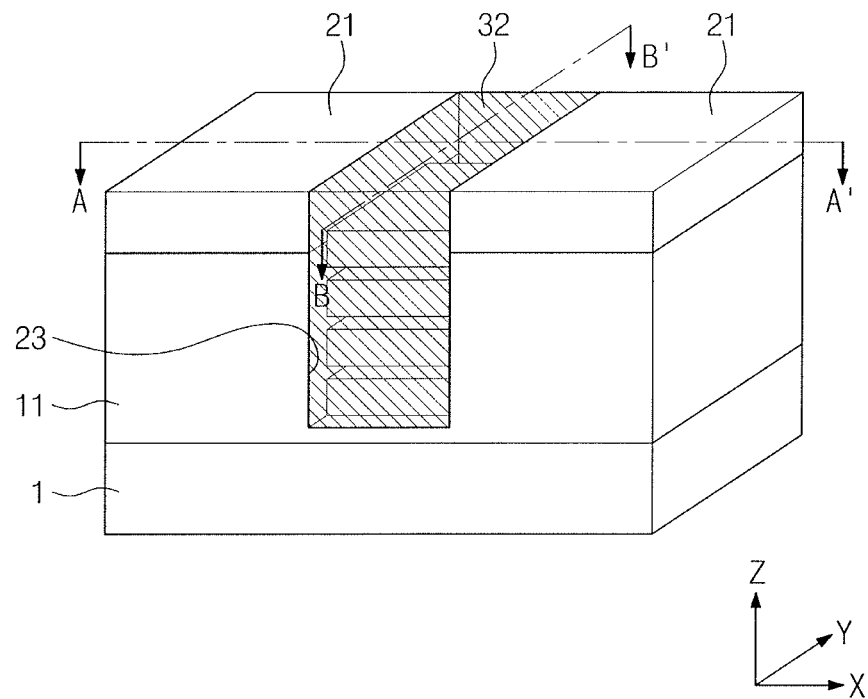
Figure 16B:
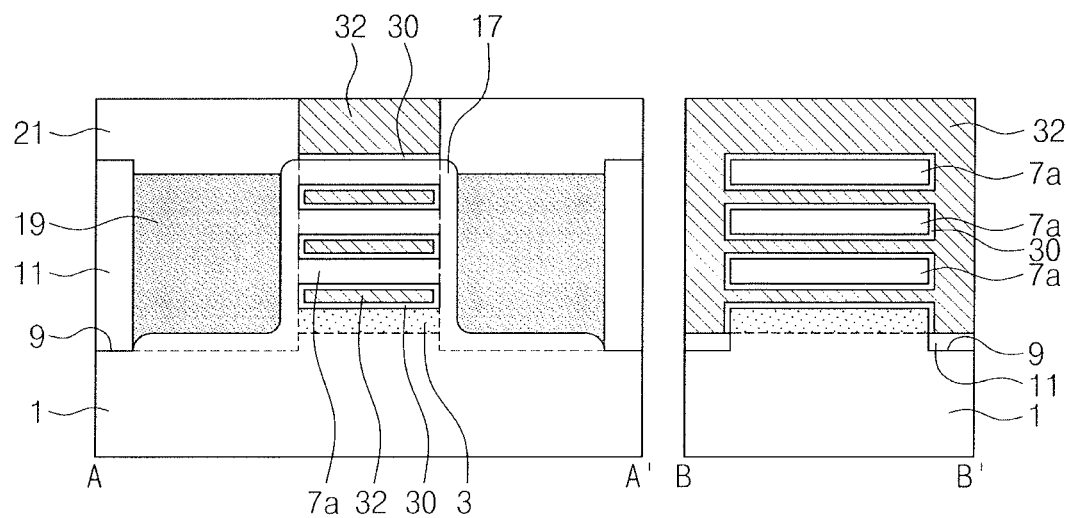

Referring to FIGS. 16A and 16B, a gate insulating layer 30 may be formed on the surface of the silicon patterns 7a and the semiconductor substrate 1 by performing a thermal oxidation process or a deposition process. The gate insulating layer 30 may include at least one of a silicon oxide layer, a silicon nitride layer, or a metal oxide layer. On the all over the surface of the semiconductor substrate 1, a conductive layer may be stacked, and an etch back process or a chemical mechanical polishing (CMP) process may be performed to expose the tops of the second mask patterns 21 and to form a gate electrode 32 that fills a space between the second mask patterns 21, the openings 23, and the empty spaces 27 between the silicon patterns 7a at the same time. The gate electrode 32 may include at least one of impurity-doped polysilicon, metal silicide or a metal layer. The metal layer may be, for example, at least one of cobalt, copper, aluminum, or tungsten. The metal silicide may be, for example, cobalt silicide.

Figure 17A:
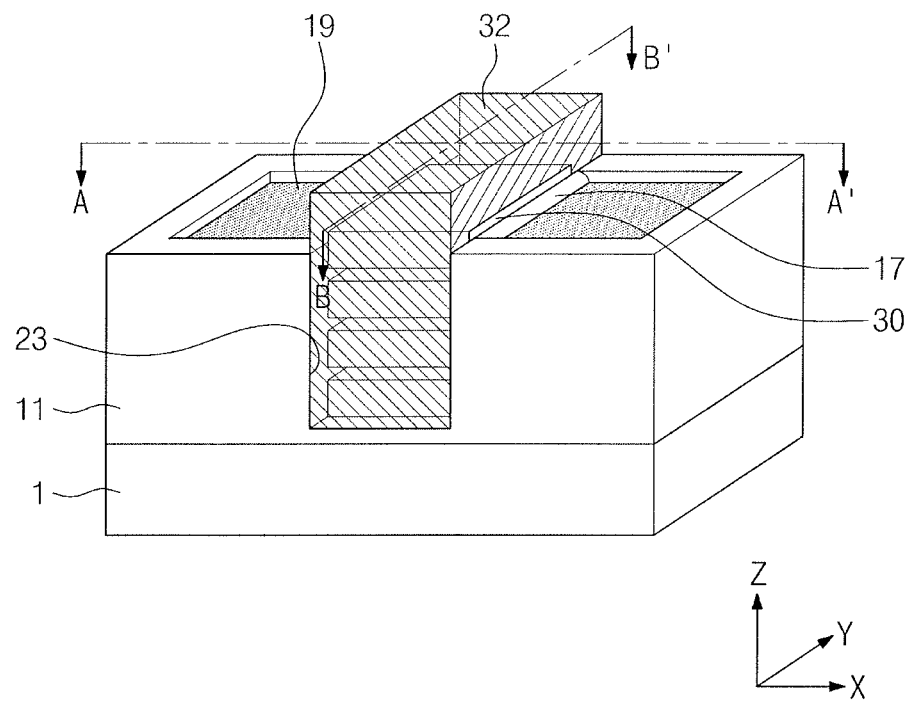
Figure 17B:
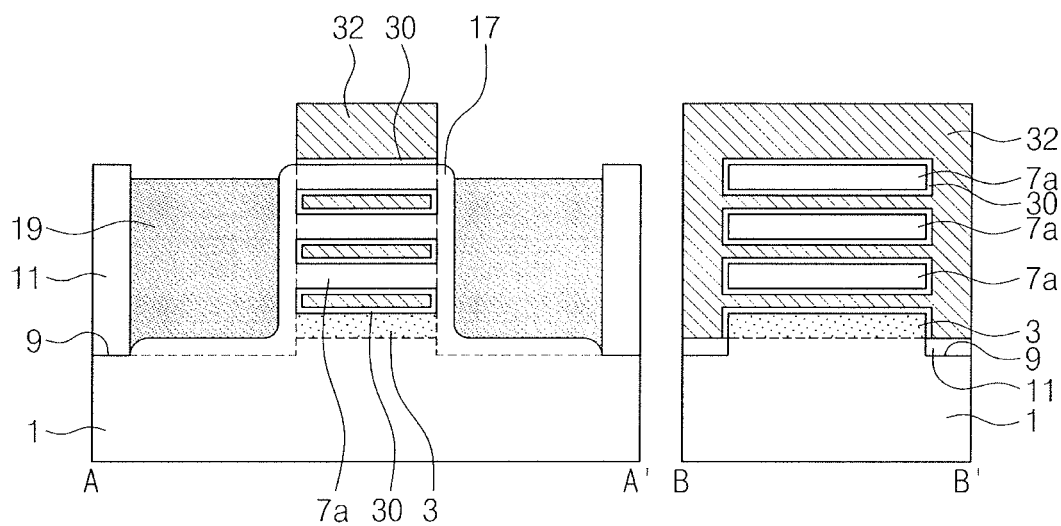

Referring to FIGS. 17A and 17B, the second mask patterns 21 may be removed to expose the top of the device isolation layer 11 and the tops of the source/drain patterns 19. Thus, a semiconductor device having a MBC MOSFET structure may be fabricated. In the description, the damage of the device isolation layer 11 may be prevented by a pre-treatment process using a pre-treatment composition. Accordingly, a semiconductor device having improved reliability may be fabricated.

By way of summation and review, for a size reduction to less than about 20 nm, semiconductor devices may become more difficult to form by MOS. Thus, methods for improving performance not by scaling down but by changing a structure, etc. are under consideration. For example, a multibridge-channel (MBC) MOSFET has been considered, wherein a plurality of thin silicon bridges are disposed to form a stacked structure and a gate has a structure wrapping the silicon bridges. Due to such structural characteristics, the MBC MOSFET may attain a driving current having about 4.6 times that of a planar MOSFET and may secure electrical properties close to an ideal value.

As described above, embodiments may provide a pre-treatment composition for use before etching SiGe for passivating a silicon oxide layer.

Embodiments may also provide a method of fabricating a semiconductor device that may reduce or prevent defects.

A pre-treatment composition for use before etching SiGe according to an example embodiment may passivate a silicon oxide layer to prevent or reduce the damage of the silicon oxide layer while performing a subsequent SiGe etching process.

In a method of fabricating a semiconductor device according to an example embodiment, a pre-treatment process for passivating a silicon oxide layer may be performed using a pre-treatment composition for use before etching SiGe, and the damage of the silicon oxide layer may be prevented or reduced and defects may be decreased, and thus, a semiconductor device having improved reliability may be manufactured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pre-treatment composition for use before etching SiGe, the composition consisting essentially of:
   sulfuric acid in an amount of about 0.01 wt % to about 0.1 wt %;
   isopropyl alcohol in an amount of about 1 wt % to about 80 wt %;
   a silane compound represented by one of the following Formulae (1-1), (1-2), (1-3), (1-4), (1-5), (1-6) or (1-7) in an amount of about 0.01 wt % to 0.9 wt %; and
   de-ionized water in an amount of greater than 19 wt % to about 98.98 wt %,
   all wt % being based on a total weight of the composition,

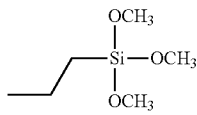  (1-1)

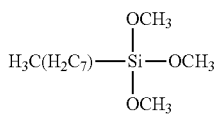  (1-2)

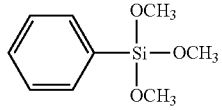  (1-3)

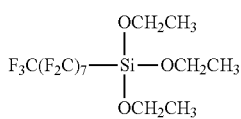  (1-4)

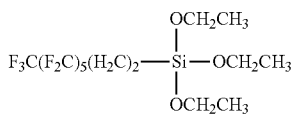  (1-5)

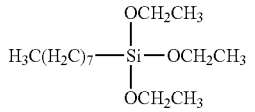  (1-6)

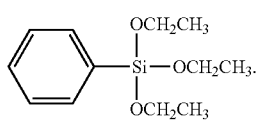  (1-7)

2. The pre-treatment composition as claimed in claim 1, wherein the silane compound represented by one of Formulae (1-1), (1-2), (1-3), or (1-7),

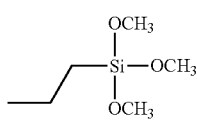  (1-1)

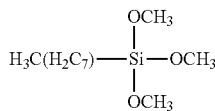  (1-2)

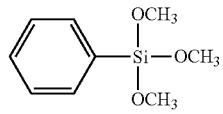  (1-3)

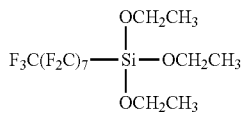  (1-4)

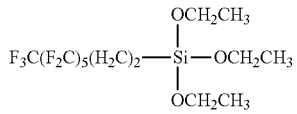  (1-5)

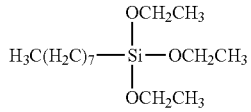  (1-6)

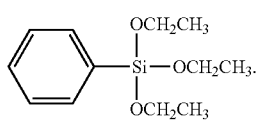  (1-7)

3. A method of fabricating a semiconductor device, the method comprising:
   forming an insulation pattern, a silicon pattern, and a SiGe pattern on a semiconductor substrate;
   supplying the pre-treatment composition as claimed in claim 1 to form a passivation layer on the insulation pattern; and
   etching the SiGe pattern using a SiGe etching composition.

4. The method as claimed in claim 3, further comprising performing heating or light irradiation to the passivation layer to increase bonding force between the passivation layer and the insulation pattern.

5. The method as claimed in claim 3, further comprising performing heating of the passivation layer at a temperature of about 70° C. to about 200° C. for about 0.1 minutes to about 30 minutes to increase bonding force between the passivation layer and the insulation pattern, or performing light irradiation to the passivation layer with a wavelength of about 100 nm to about 400 nm for about 0.1 minutes to about 30 minutes to increase bonding force between the passivation layer and the insulation pattern.

6. The method as claimed in claim 3, wherein the SiGe etching composition removes the passivation layer.

7. The method as claimed in claim 3, wherein the SiGe etching composition includes an acid, an oxidant, and de-ionized water.

8. The method as claimed in claim 7, wherein the SiGe etching composition further includes a surfactant.

9. The method as claimed in claim 1, wherein:
   the forming of the insulation pattern, the silicon pattern, and the SiGe pattern on the semiconductor substrate includes:
   sequentially stacking a SiGe layer and a silicon layer on a semiconductor substrate;

pattering the silicon layer and the SiGe layer to form a trench that exposes the semiconductor substrate, and to form the silicon pattern and the SiGe pattern; and forming the insulation pattern for partially filling the trench and exposing side walls of the silicon pattern and the SiGe pattern, and the etching of the SiGe pattern includes removing the SiGe pattern to expose a bottom surface of the silicon pattern and a top surface of the semiconductor substrate.

10. The method as claimed in claim 9, wherein the insulation pattern includes silicon oxide.

\* \* \* \* \*